United States Patent [19]
Chun

[11] Patent Number: 5,644,169
[45] Date of Patent: Jul. 1, 1997

[54] MOLD AND METHOD FOR MANUFACTURING A PACKAGE FOR A SEMICONDUCTOR CHIP AND THE PACKAGE MANUFACTURED THEREBY

[75] Inventor: Heung Sup Chun, Seoul, Rep. of Korea

[73] Assignee: Goldstar Electron Co., Ltd., Cheongju, Rep. of Korea

[21] Appl. No.: 624,204

[22] Filed: Apr. 3, 1996

Related U.S. Application Data

[63] Continuation of Ser. No. 203,243, Mar. 1, 1994, abandoned.

[30] Foreign Application Priority Data

Mar. 4, 1993 [KR] Rep. of Korea ............... 3229/1993

[51] Int. Cl.$^6$ ................................. H01L 23/28
[52] U.S. Cl. ..................... 257/787; 257/680; 257/710
[58] Field of Search .................... 257/710, 787, 257/704, 680, 681

[56] References Cited

U.S. PATENT DOCUMENTS

| 4,663,833 | 5/1987 | Tanaka et al. | 257/680 |
| 4,760,440 | 7/1988 | Bigler et al. | |
| 4,769,344 | 9/1988 | Sakai et al. | 257/680 |
| 4,894,707 | 1/1990 | Yamawaki et al. | 757/680 |
| 5,122,861 | 6/1992 | Tamura et al. | 257/680 |

FOREIGN PATENT DOCUMENTS 63-274162  11/1988  Japan.

*Primary Examiner*—Mahshid D. Saadat
*Assistant Examiner*—S. V. Clark
*Attorney, Agent, or Firm*—Fleshner & Kim

[57] ABSTRACT

A mold and a method for manufacturing a semiconductor package and the semiconductor package manufactured thereby.

The semiconductor package includes a chip attached to a paddle of a lead frame. And with electrically connecting the chip and inner leads of lead frame with a metal wire, a semi-finished product having electric connections is molded by using molding dies having an extrusion in a cavity for providing an opening on an upper portion of a light receiving region of the chip, and a transparent lid is provided on the upper portion of the opening of the semiconductor package.

With the invention being able to provide an excellent resin semiconductor package and improved manufacturing processes, thereby reducing the manufacturing cost, enhancing a productivity and making a manufacturing process simpler.

10 Claims, 3 Drawing Sheets

MOLD AND METHOD FOR MANUFACTURING A PACKAGE FOR A SEMICONDUCTOR CHIP AND THE PACKAGE MANUFACTURED THEREBY

This application is a continuation of U.S. application Ser. No. 08/203,243 filed Mar. 1, 1994, now abandoned.

BACKGROUND OF THE INVENTION

1. Field of the Invention

The present invention relates to a mold and method for manufacturing a semiconductor package and the semiconductor package manufactured thereby, and more particularly to a mold for the semiconductor package having a protrusion provided in a cavity of a mold die for providing an opening of a molded body which is molded in a transfer molding method for a light receiving region.

2. Description of the Prior Art

Typically, in the package of the light receiving device like CCD(Charge-coupled device) or EPROM(Electrically Programmable Read only Memory), etc., the light receiving region of the light receiving device is provided for receiving an outside light.

The package of the conventional CCD is illustrated in FIG. 1., which includes a body 1 having an opening 2 provided on an upper portion thereof, a CCD in a chip state is provided on a lower portion 2a of the opening 2 with an adhesive 4, a plurality of bond pads(not illustrated) of CCD and ends of a plurality of lead fingers(not illustrated) provided inside the body 1 of the semiconductor package electrically connected with a plurality of metal wires 5, respectively, and further more, a plurality of out leads 6 and other ends of a plurality of the lead fingers electrically connected with a plurality of metal wires, and transparent lid 7 provided on a neck 2b of the opening 2.

Referring to FIG. 2 illustrating a manufacturing process of the package of the conventional CCD, in a first step S11, there is provided the body 1 of a ceramic package for CCD by an additional manufacturing process. On both sides of the body 1 of the ceramic package, a plurality of the lead fingers(not illustrated) are brazed to a plurality of the outer leads 6, respectively.

In addition, there is provided a wafer having a plurality of circuit patterns through other manufacturing processes.

In a sawing process, the wafer is separated into a plurality of chips of CCD 3. In a second step S12 of a die attaching, a lower surface of CCD 3 is attached to a lower portion 2a of the opening 2 of the semiconductor package body with the adhesive 4. In a third step of electrically connecting with the metal wire, a plurality of bond pads(not illustrated) of CCD and a plurality of lead fingers(not illustrated) of the semiconductor package body are electrically connected with the metal wires, respectively. In a fourth step of the transparent lid sealing, the transparent lid 7 is sealed on the neck 2b of the opening 2 with a sealant 8.

At this time, the sealing of the transparent lid is usually performed for 1 to 24 hours at 150°–175° C.

In a 5th step of trimming, a plurality of outer leads 6 brazed at both sides of the semiconductor package body 1 is trimmed to a predetermined form, respectively.

Finally, a marking of CCD 3 is performed.

Meanwhile, except for the above-described package manufacturing process, there is widely well known one of cer-dip type package technologies.

In a manufacturing process of a package of CCD according to the conventional cer-dip process, there are provided a ceramic base and the plurality of ceramic leads through an additional process. On a plurality of ceramic leads is provided a transparent lid. CCD is attached to a lower portion of the opening of the ceramic base with a plurality of lead frame. And, the ceramic leads are attached to the ceramic base.

Accordingly, through the conventional methods for manufacturing the package of CCD, there are required relatively complex and additional processes for the semiconductor package body of CCD. For manufacturing the package, it needs a pre-prepared semiconductor package body, thereby increasing the manufacturing cost and lowering the productivity.

So, there have been researched and developed the improved manufacturing methods of the package of CCD, which use resinous materials exhibiting excellent molding properties at a lower price.

Among these researches and developments, there were a method including the steps of attaching CCD to a paddle of the common lead frame with an adhesive, electrically connecting the bond pads of CCD and the inner leads of lead flames with metal wires, placing a transparent lid on the opening with an adhesive tape, and obtaining a molded body with a plastic for preventing CCD by using a transfer molding technology.

But, in the method of manufacturing a plastic package of CCD according to a conventional technology, since it needs additional process for attaching an adhesive tape to circumferential portion of a light receiving region of CCD for securing an opening between CCD and a transparent lid for protecting the light receiving region of CCD, the process of is complicated and requires more time to manufacture.

SUMMARY OF THE INVENTION

Accordingly, it is an object of the present invention to provide a mold for a semiconductor package having a protrusion provided in a cavity of an upper mold die for providing an opening of a molded body for a light receiving region.

It is another object of the present invention to provide a semiconductor package manufactured by using the mold described above.

It is a further object of the present invention to provide a method for manufacturing the semiconductor package by using the mold described above.

The mold for the semiconductor package according to the present invention includes a lower mold die and an upper mold die having a protrusion, which is provided on a predetermined portion of a cavity, for providing an opening of the molded body of the chip on a predetermined portion of the chip.

And, a method for manufacturing the semiconductor package according to the present invention includes the steps of electrically connecting the chip provided on a paddle of a lead frame and a plurality of inner leads of the lead frame with metal wires.

In addition, the semiconductor package according to the present invention includes a chip provided on a paddle of a lead frames and the inner leads of the lead frames, which are electrically connected with the metal wires, respectively, and the opening of the molded body is provided for exposing a predetermined upper portion of the chip.

BRIEF DESCRIPTION OF THE DRAWINGS

The above and other object, features and advantage of the present invention will be more clearly understood from the following detailed description taken in conjunction with the accompanying drawings.

DESCRIPTION OF THE PREFERRED EMBODIMENTS

Figure 1:
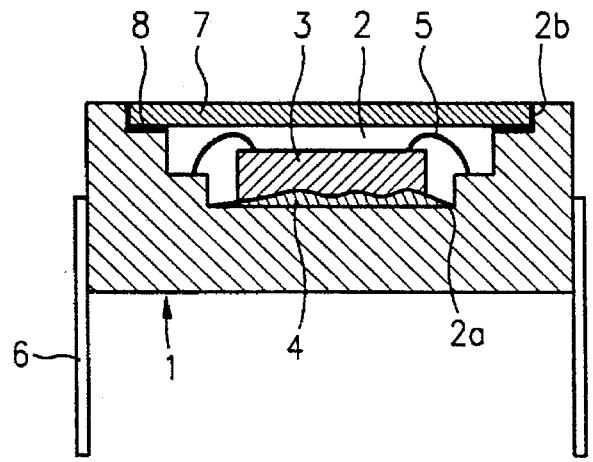
FIG. 1 is a sectional view illustrating a structure of a conventional ceramic CCD package.
Figure 2:
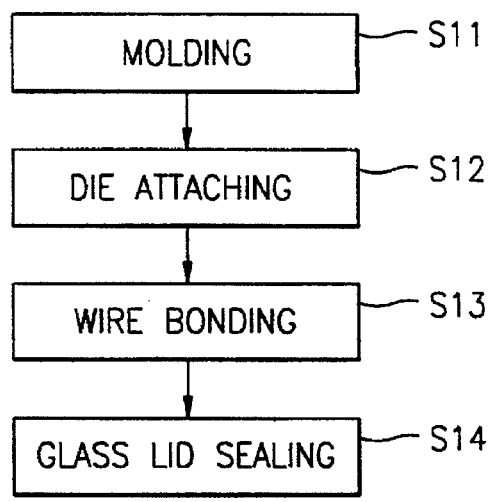
FIG. 2 is a flow chart illustrating a manufacturing process of the conventional ceramic CCD package of FIG. 1.
Figure 3:
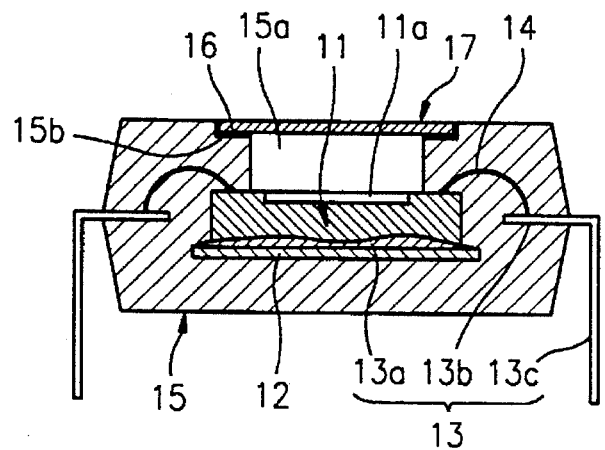
FIG. 3 is a sectional view illustrating a structure of a semiconductor package according to the present invention.

Referring to FIG. 3, a package of CCD includes a CCD 11 in a chip state lower surface of CCD 11 attached at a lower surface thereof on an upper surface of a paddle 13a of a lead frame 13 with an adhesive 12, an upper surface of a plurality of inner leads of the lead frame 13 being electrically connected to a plurality of bond pads(not illustrated) of CCD, respectively, with a metal wire 14, a molded body 15 of a plastic resin encapsulating the CCD 11, except for a light receiving region 11a, the metal wires 14, a paddle 13a of a lead frame 13, and inner leads 13b of the lead frame 13. The package of CCD further includes a plurality of outer leads 13c of the lead frame 13 extended from the sides of the molded body 15, an opening 15a of the molded body 15 provided above the light receiving region 11a, a transparent lid 17 attached to the neck 15b provided on an upper portion of the opening 15a of the molded body 15 with a sealant 16.

Figure 4:
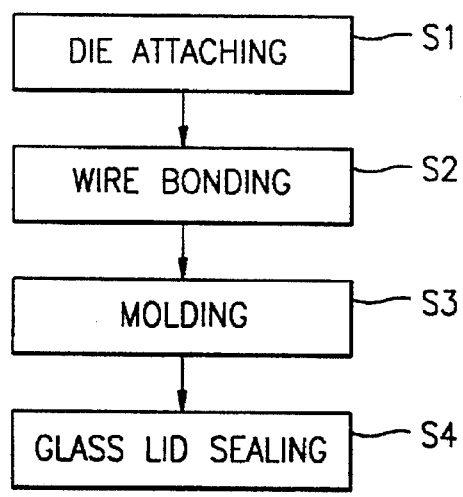
FIG. 4 is a flow chart illustrating a manufacturing process according to the present invention.

Referring to FIG. 4 illustrating a manufacturing process of a package of a plastic CCD and FIG. 3.

There are provided a wafer having a plurality of circuit patterns of CCD.

In a sawing step, the wafer is separated into chips of CCD 11. And, in a first step S1 of a die attaching, a lower surface of CCD 11 is attached to an upper surface of the paddle 13a of the lead frame 13 in example with an epoxy adhesive.

Furthermore, in a second step S2 of a wire connecting, a plurality of bond pads(not illustrated) of CCD 11 are connected a plurality of inner leads 13b of the lead frame 13 with metal wires 14, for example Al or Au, respectively. Consecutively, in a third step of molding, a semi-finished product having CCD 11, metal wires 14, paddle 13a and inner leads 13b of lead frame 13 from above process is provided inside a mold 21 as illustrated in FIG. 5.

At this time, a lower surface of an extension provided for preventing a formation of resinous materials during molding of a protrusion 23 of the mold 21 is in a contact with outer surface of the upper surface of the light receiving region 11a of CCD.

Through these processes, a molded body 15 is manufactured with an introduction of a resinous material into a cavity of upper and lower mold dies 21a and 21b by using the transfer molding method.

Figure 5:
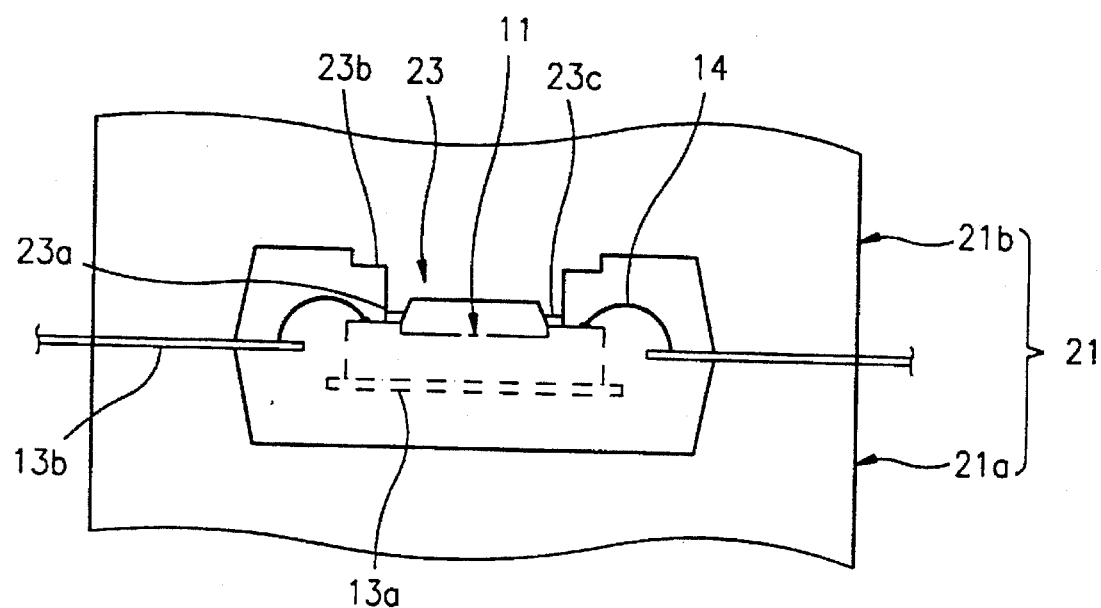
FIG. 5 is a schematic sectional view illustrating mold dies on which a chip electrically connected with a metal wire is provided according to the semiconductor package of the present invention.

Meanwhile, referring to FIG. 5, the mold 21 includes a lower mold die 21a and an upper mold die 21b.

The lower mold die 21a is one of usual mold dies, having a cavity provided on the lower mold die, and the upper mold die 21b also has a cavity provided on the lower surface of the upper mold die, having a protrusion 23 downwardly extended from the upper surface of the cavity.

In addition, on a circumferential portion of the upper surface of the protrusion 23 of the mold die 21b is provided a shoulder 23b, and on a circumferential portion of a lower surface of the protrusion 23 is provided an extension 23a for preventing the formation of resinous materials during molding.

On the lower surface of the extension 23a provided for preventing the resinous formation thereon, there is provided a buffering member(not illustrated) for preventing any damage of CCD from unrequired pressure for both mold dies 21a, 21b. The buffering member is made of other materials from the molded body and can be provided on the lower surface of the extension 23a.

The buffering member 23c for buffering any unrequired pressure is one of resinous materials and may be coated or laminated on the lower surface of the extension 23a.

Meanwhile, the molded body 15 made of resinous materials encapsulates CCD 11 of semi-finished product, metal wires 14, paddle 13a and inner leads 13b of the lead frame 13. In the course of the molding, since the resinous materials are not formed on the light receiving region of CCD 11 due to the prevention of the extension 23a as illustrated in FIG. 5, the opening 15a of the molded body 15 may be provided.

In addition, on the upper surface of the opening 15a of the molded body 15 is provided a neck 15b from the shoulder 23b of the protrusion 23.

In a fourth step of the transparent lid sealing, the transparent lid 17 is fixedly provided on the neck 15b with the sealant 16.

In a 5th step of the plating, a plurality of outer leads 13c of the lead frame 13 is plated in the usual manner.

In a 6th step of the trimming and forming, the plated outer leads 13c is taken as a final process.

Accordingly, as illustrated in FIG. 3, the package of CCD is obtained.

As described so far, the present invention provides a simplified manufacturing process of the package by using the resinous materials having an excellent molding properties at a lower price through the transfer molding method, thereby increasing the productivity and reducing the manufacturing cost.

What is claimed is:

1. A mold for manufacturing a package for a semiconductor chip, comprising:

a lower mold die;

an upper mold die having a recess; and a protrusion provided on a predetermined portion of the recess to cover a light receiving area of the semiconductor chip for providing an opening of a molded body of the package, wherein the protrusion includes an extension provided on a portion of a first surface thereof and extending beyond said first surface of the protrusion for preventing a formation of a molding resin on a predetermined portion of the package, wherein the molded body of the package is formed in an area defined by said lower and upper mold dies, said protrusion and said extension, and said protrusion and extension are not part of the package manufactured using the mold.

2. The mold of claim 1, wherein the buffering member is coated with a resin of polymer group.

3. The mold of claim 1, wherein the buffering member is laminated with a resin of polymer group.

4. The mold of claim 1, wherein said protrusion includes a shoulder for introducing a transparent lid.

5. The mold of claim 1, wherein the extension includes a buffering member thereon at the first surface thereon for preventing the light receiving area of the semiconductor chip from being damaged.

6. The mold of claim 1, wherein the extension is provided on a peripheral portion of the first surface thereof.

7. The mold of claim 1, wherein said extension is integral with said protrusion.

8. The mold of claim 5, wherein said buffering member is integral with said extension.

9. The mold of claim 1, wherein the first surface is a bottom surface.

10. The mold of claim 1, wherein said protrusion and extension cover a light receiving region of the semiconductor chip.

* * * * *